(12) United States Patent
Hsieh et al.

(10) Patent No.: US 8,399,162 B2
(45) Date of Patent: Mar. 19, 2013

(54) METHOD OF FORMING EXPOSURE PATTERNS

(75) Inventors: Wen-Jen Hsieh, Taoyuan County (TW); Ying-Hung Chuang, Taoyuan County (TW); Feng-Chin Tang, Taoyuan County (TW)

(73) Assignee: Chunghwa Picture Tubes, Ltd., Bade, Taoyuan County (TW)

( * ) Notice: Subject to any disclaimer, the term of this patent is extended or adjusted under 35 U.S.C. 154(b) by 350 days.

(21) Appl. No.: 12/775,931

(22) Filed: May 7, 2010

(65) Prior Publication Data

US 2011/0189597 A1 Aug. 4, 2011

(30) Foreign Application Priority Data

Jan. 29, 2010 (TW) ................ 99102680 A

(51) Int. Cl.
 *G02B 5/20* (2006.01)
(52) U.S. Cl. .......................... 430/7; 430/394
(58) Field of Classification Search ........... None
 See application file for complete search history.

(56) References Cited

U.S. PATENT DOCUMENTS

| | | | | |
|---|---|---|---|---|
| 6,037,084 A * | 3/2000 | Ting et al. | ............ | 430/7 |
| 6,106,139 A * | 8/2000 | Sugiyama et al. | ............ | 362/326 |
| 2001/0026347 A1 * | 10/2001 | Sawasaki et al. | ............ | 349/156 |
| 2003/0224255 A1 * | 12/2003 | Fujimori | ............ | 430/7 |
| 2007/0153213 A1 * | 7/2007 | Huang et al. | ............ | 349/155 |

FOREIGN PATENT DOCUMENTS

| | | |
|---|---|---|
| TW | 1245160 | 12/2005 |
| TW | 200907560 | 2/2007 |

* cited by examiner

*Primary Examiner* — John A. McPherson
(74) *Attorney, Agent, or Firm* — Muncy, Geissler, Olds & Lowe, PLLC

(57) ABSTRACT

The present invention discloses a method of forming exposure patterns. These steps of the present method comprise: a substrate is provided; a photoresist layer is formed over the substrate; subsequently, a photo mask with a pattern is placed and aligned to a corresponding location over the photoresist layer for at least double exposure processes, and the photo mask with a pattern is moved and aligned to another corresponding location over the photoresist layer during at least one exposure process; successively, at least one filter is provided to perform at least one exposure process, and the filter is placed above or below the photo mask; and the patterns with different dimensions are consequently formed on the substrate after partial photoresist is removed during a later developing process.

8 Claims, 6 Drawing Sheets

METHOD OF FORMING EXPOSURE PATTERNS

FIELD OF THE INVENTION

The present invention relates to a lithography process, and more particularly to a lithography process in which a filter is introduced to perform at least one exposure process for forming a plurality of patterns with different dimensions.

BACKGROUND OF THE INVENTION

Lithography process is an essential and important procedure to a variety of electric devices, such as semiconductor devices and liquid crystal display. In general, a lithography process comprises a step of allowing lights or rays radiate through a photo mask with pre-designed patterns to a substrate coated with a photoresist layer for illuminating the photoresist layer corresponding to these patterns, then the substrate is subject to a developer solution for removing un-exposure photoresist layer to form patterns corresponding to the pre-designed patterns on the substrate. Alternatively, depending on the different material of photoresist, an exposure photoresist layer will be removed in the developer solution.

The patterns formed on the substrate by the foregoing lithography process, these patterns have the same dimensions or sizes because the environmental parameters to the whole photoresist layer are the same during the exposure process. However, for certain electric devices, the structure of the patterns with different dimensions is demanded. For this kind of electric devices, a plurality of lithography processes for different dimensions are needed. For example, when an electric device having patterns with two different dimensions, the fabricating process of the electric device requires two different lithography processes. The steps of the aforementioned fabricating process includes a steps of forming a photoresist layer with a thickness on a substrate by spin-coating; subsequently, a photo mask with patterns is placed and aligned to a corresponding location over the photoresist layer for exposure process; successively, a development process and a post-bake process are performed for forming a plurality of first patterns with a first dimension. After the first patterns are formed by this lithography process, next lithography process for forming a plurality of second patterns with a second dimension is processed. The steps of the later lithography process includes steps of forming another photoresist layer with different thickness from previous one on the substrate by spin-coating; subsequently, the photo mask with patterns is used again and is placed and aligned to a corresponding location over the later photoresist layer for second exposure process; successively, the first patterns structure and second patterns structure are constructed on the substrate after another development process and another post-bake process are performed.

These processes for forming the layers with different dimensions are almost the same. Moreover, it takes quite a long time to perform the fabricating process due to several lithography processes. Thus, the cost of production for a device with such kind of structure is relatively expensive.

In order to solve the foregoing problem, a multi tone mask utilized to reduce the steps of lithography processes is introduced. The multi tone mask is a kind of photo mask which has a plurality of patterns regions with various transmittances thereon. Referring to FIG. 1, it shows an illustration of a lithography process with a multi tone mask. The multi tone mask 100 has a first pattern region 101 with a first percentage of transmittance, and a second pattern region 103 with a second percentage of transmittance. For example, the first percentage of transmittance is 100%, and the second percentage of transmittance is X %. During the exposure process of the lithography process with the multi tone mask 100, the light will all pass through the first pattern region 101 with the 100% transmittance and only X percent of the light will pass through the second region 103 with the X % transmittance. Thus, the photoresist layer coated on a substrate 110 will produce different dimensions of patterns structures after developing process, such as large size patterns 111 and small size patterns 113 as shown in FIG. 1, due to different levels of photoreaction to the different regions of the photoresist layer on the substrate 110 according to different light intensities. Therefore, a plurality of dimension of patterns structure formed on the substrate only needs one lithography process by utilizing a multi tone mask designed a plurality of corresponding pattern regions with different transmittances when the different dimensions of the patterns structure is required.

Referring to Taiwan issue patent No. I245160, which relates to a method of forming a stamper of a light guide plate by half-tone technology, and it discloses a lithography process with a half-tone technology for forming a plurality of photoresist patterns with different highnesses on a light guiding plate after removing parts of photoresist layer; and smooth and spherical mirror surfaces of photoresist patterns is presented after a flow process. Moreover, referring to Taiwan issue patent No. I3029089, which relates to a fabrication method of active device array substrate, and it discloses five lithography processes for forming a gate, a channel layer, a source, a drain, a protective layer, and a pixel electrode on a thin-film transistor (TFT) array substrate are reduced to three lithography processes by utilizing multi tone mask. Thus, the fabricating time and cost of produce are reduced. Furthermore, referring to Taiwan publication patent application No. 200907560, which relates to an exposure process, a fabricating method of pixel structure and half tone mask thereof. It refers to a lithography process for a glass substrate with large surface causes a non-uniform dimensions problem of the photoresist patterns. This problem can be solved by utilizing a half tone mask (a kind of multi tone mask) to form uniform size of the photoresist patterns on a large surface. As mentioned above, multi tone masks are widely used in the lithography processes in the recent year.

However, multi tone masks designed several patterns regions with different transmittances thereon for fabricating the patterns with different dimensions or sizes, so that the cost of fabricating multi tone masks is very high. For example, the cost of fabricating multi tone masks is over 2~3 times higher than the cost of fabricating traditional photo masks. Although, the multi tone mask technology may reduce the lithography processes to fabricate a device, however, the cost of fabricating the device is still high due to the high cost of the multi tone masks.

Therefore, it is required a lithography process for forming a photoresist structure having patterns with different dimensions to not only reduce the fabricating time but also the cost of the production.

SUMMARY OF THE INVENTION

An object of the present invention is to provide a lithography process for forming patterns with different dimensions or sizes by only utilizing a normal photo mask. Moreover, both of the fabricating time and the cost of production can be reduced effectively.

Another object of the present invention is to provide a lithography process for forming patterns with different dimensions or sizes without multi tone masks to solve the high cost issue raised by the expensive multi tone masks.

In order to reach above-mentioned object, the present invention provides a method of forming exposure patterns comprising steps of providing a substrate; forming a photoresist layer on the substrate; placing a photo mask with patterns over the photoresist layer and aligning to a corresponding location for performing at least two exposure processes, wherein at least one exposure process includes a step of moving the photo mask to another corresponding location; subsequently providing at least one filter to perform at least one exposure process, wherein the filter is placed above or below the photo mask; and performing a developing process to remove parts of the photoresist layer for forming patterns structure with different dimensions on the substrate.

In order to reach above-mentioned object, the present invention provides an exposure method of a color filter comprising providing a color filter; forming a photoresist layer on the color filter; placing a photo mask with patterns over the photoresist layer and aligning to a corresponding location for performing at least two exposure processes, wherein at least one exposure process comprises the step of moving the photo mask to another corresponding location; subsequently providing at least one filter placed above or below the photo mask to perform at least one exposure process, and there after performing a developing process to remove parts of the photoresist layer for forming a plurality of photo spacer structures and a plurality of multi-domain vertical align structures on the color filter, wherein the photo spacer (PS) structures and the multi-domain vertical align (MVA) structures have different dimensions.

In certain embodiments of the present invention, the transmittance of the filter is lower than the one of vacuum; and the transmittance depends on the patterns structure with different dimensions. In another certain embodiments of the present invention, the filter includes a magnesia substrate or a chromium oxide substrate. Moreover, in some embodiments of the present invention, the material of the photoresist comprises negative photoresist material or positive photoresist material depending on the requirements.

A detailed description is given in the following embodiments and with reference to the accompanying drawings and claims.

DETAILED DESCRIPTION OF THE PREFERRED EMBODIMENT

The invention hereinafter will be described in greater detail with preferred embodiments of the invention and accompanying illustrations. Nevertheless, it should be recognized that the preferred embodiments of the invention are not provided to limit the invention but to illustrate it. The present invention can be practiced not only in the preferred embodiments herein mentioned, but also in a wide range of other embodiments besides those explicitly described. Further, the scope of the present invention is expressly not limited to any particular embodiments except what is specified in the appended Claims.

The present invention and embodiments now are described in detail. In diagrams and descriptions as below, the same symbols are utilized to represent the same or similar elements. The main of features of the embodiments of the present invention are described in highly simplified illustration. Otherwise, the drawings of the present invention do not depict every characteristic of the actuality embodiments, and all elements of the drawings are not depicted in proportional size but in relative size.

The present invention discloses a method of forming exposure patterns. This method comprises a lithography process for forming patterns with different dimensions or sizes free of multi tone masks or repeating the lithography process. Therefore, the purpose to reduce the fabricating time and cost could be approached effectively.

Figure 1:
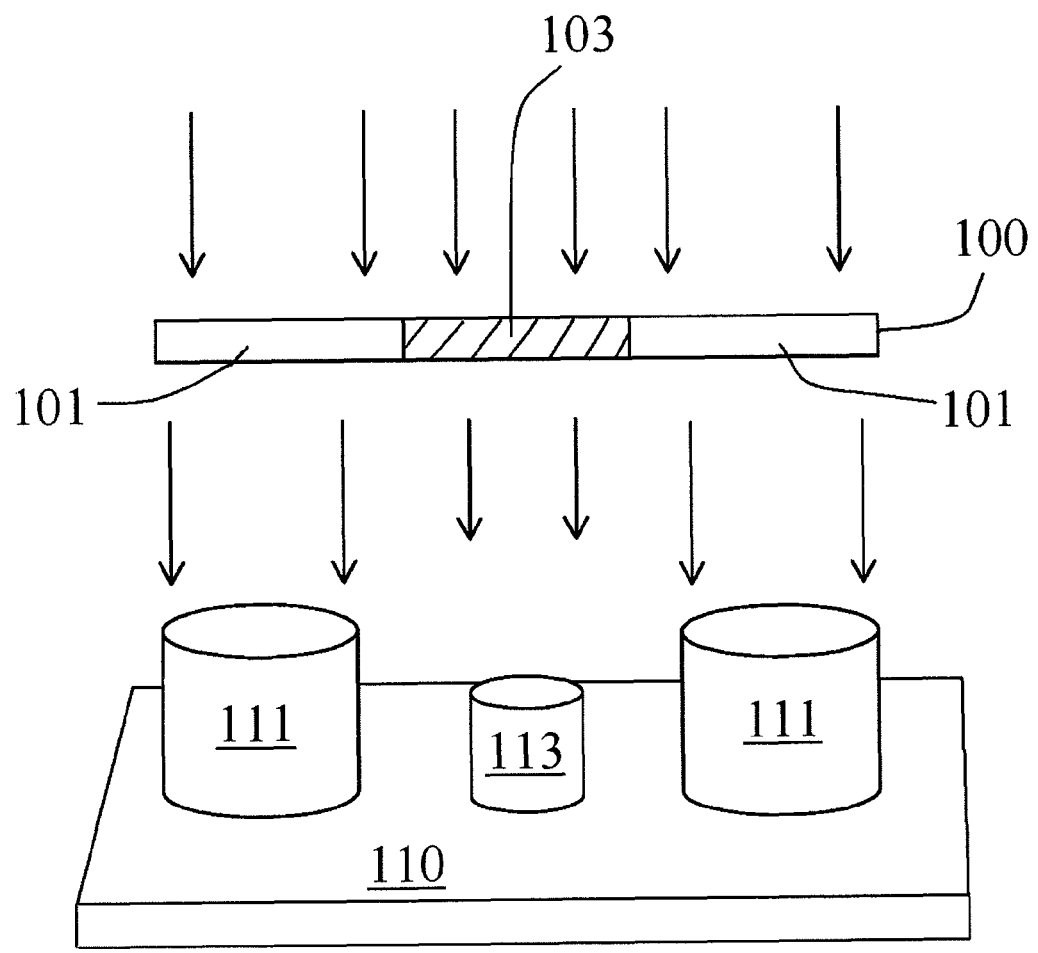
FIG. 1 shows an illustration of a lithography process with a multi tone mask.
Figure 2:
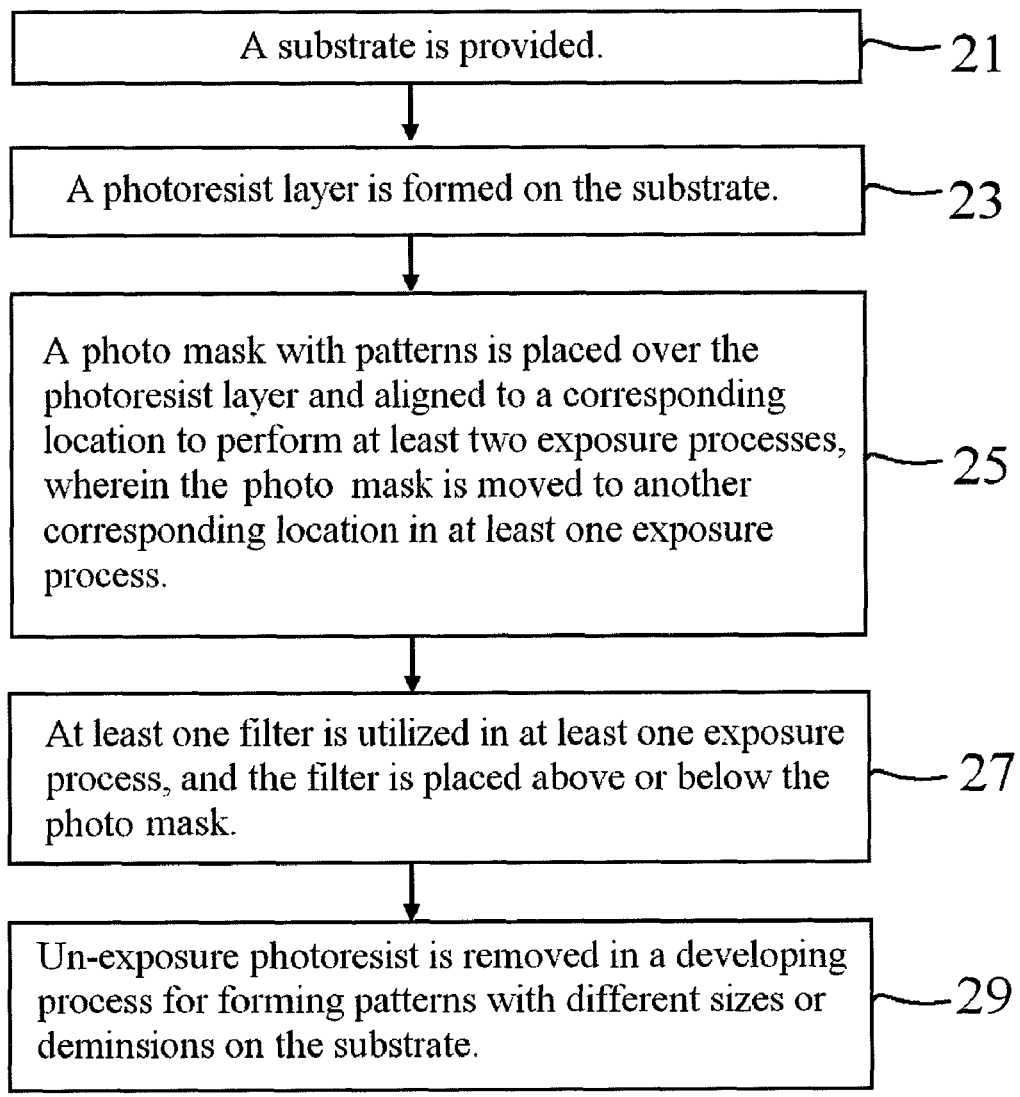
FIG. 2 shows a flow chart of a method of forming exposure patterns according to the present invention.

Referring to FIG. 2, it shows a flow chart of a method of forming exposure patterns according to the present invention, and accompanying with FIGS. 3A~D to illustrate. At first, referring to the step 21 shown in FIG. 2, a substrate 210 is provided. It's appreciated that the materials of the substrate 210 would be altered according to the type of the electric devices. In certain embodiments of the present invention, the substrate 210 comprises, but not limited to, a semiconductor wafer or a glass substrate. In this step, the substrate 210 is rinsed first for removing impurities on the substrate 210, and baking the substrate 210 for removing moisture thereon to ensure qualities of the following fabricating process.

Figure 3A:
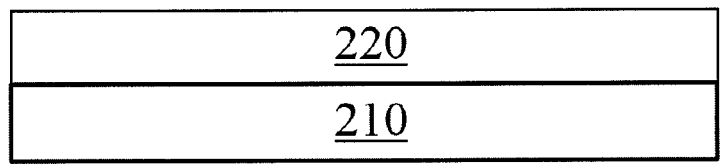
FIGS. 3A~3D show illustrations of the method of forming exposure patterns according to the present invention.

Subsequently, referring to step 23 shown in FIG. 2 and accompanying with FIG. 3A to illustrate. The step shows a photoresist layer 220 formed on the substrate 210. This step 23 of forming the photoresist layer 220 on the substrate 210 is generally divided into two sub-steps, namely, a photoresist coating step and a pre-bake step. The photoresist coating step comprises coating a photoresist layer 220 with a thickness on the substrate 210, and the thickness is based on the specifications of different electric devices. In some embodiment of the present invention, the photoresist coating step is approached by any traditional coating technologies, such as spin coating, slit and spin coating, spin-less coating, or die coating. In this embodiment, the photoresist coating step is carried on by spin-less coating for cost reduction. Moreover, the material of the photoresist is a negative photoresist material in this embodiment. The molecular chain of a negative photoresist material would be crosslink after photoreaction of the negative photoresist material during an exposure process, and the un-exposure parts of the photoresist would be removed by a developer solution during the developing process. It is appreciated that a positive photoresist material also can be adopted, and the chemical characteristic is opposite to the negative photoresist material. Furthermore, the pro-bake step also can be called as soft bake step. In this step, the purpose is to evaporate some solvent of the photoresist by heating, and let the photoresist layer 220 smooth and increase adherence by annealing.

After the photoresist layer 220 is formed on the substrate 210, referring to step 25 shown in FIG. 2, which shows a photo mask 300 with patterns is placed over the photoresist 220 and aligned to a predetermining corresponding location by alignment marks to perform at least two exposure processes. In at least one of exposure processes, the photo mask 300 is moved horizontally to align another corresponding location. The photo mask 300 is fabricated as traditional photo mask. Subsequently, referring to step 27 shown in FIG. 2, which shows that at least one filter 400 is introduced in any stage of at least one exposure process, and the filter 400 is placed above or below the photo mask 300. In other words, the filter 400 could be placed between the light source and the photo mask 300, or between the photo mask 300 and the photoresist layer 220. The foregoing corresponding location means the location of patterns with a dimension or size on the photoresist layer 220, and the another corresponding location means the location of patterns with another dimension or size on the photoresist layer 220. A person having ordinary skill in the art can understand easily that the foregoing locations would be changed depending different electric devices.

Figure 3B:
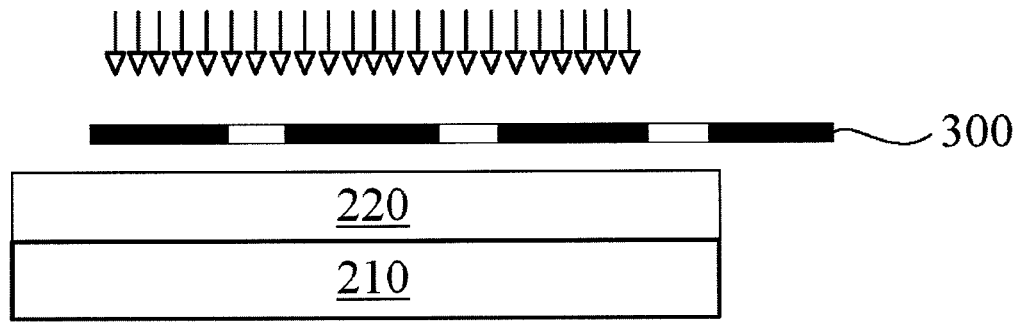
Figure 3C:
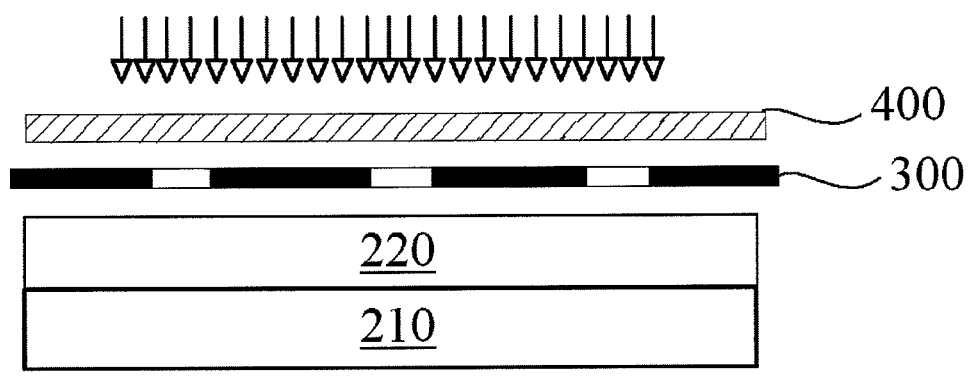
Figure 3D:
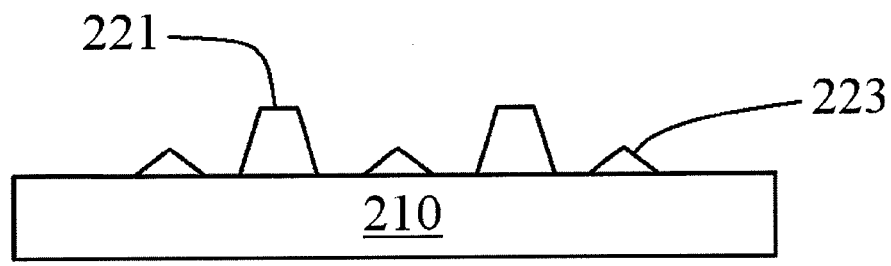

Referring to FIG. 3B, in the step 25, the photo mask 300 is placed over the substrate 210 with a photoresist layer 220, and the photo mask 300 is moved and aligned to a corresponding location over the substrate 210 for forming patterns structures with at least one dimension or size; wherein the photo mask 300 is moved to another corresponding location in one exposure process. In this embodiment, the light source in these exposure processes comprises ultraviolet ray. Subsequently, referring to FIG. 3C, in the step 27, at least one filter 400 is provided, and the filter 400 is placed above or below the photo mask 300. After the photo mask 300 aligned to another corresponding location, the filter 400 is placed above or below the photo mask 300 to perform at least one exposure process.

The filter 400 has a transmittance which is lower than the one of vacuum. It means that only certain lights or rays can pass through the filter 400 after illuminating. Thus, the light intensity of at least one exposure process is different with others, and the photoreactions of the corresponding location and the another corresponding location of the photoresist layer 220 will be different. In certain embodiments of the present invention, the filter 400 comprises a filter with low transmittance. In another certain embodiments of the present invention, the filter 400 comprises a magnesia (MgO) substrate or a chromium oxide ($Cr_2O_3$) substrate. A person having ordinary skill in the art would appreciate that the transmittance mentioned above could be changed depending on the requirements of different structures, but not limited to a specify number.

It's noted that the step 25 and step 27 are exchangeable steps with each other. In another embodiment of the present invention, a filter 400 is first utilized to place above or below the photo mask 300, and the photo mask 300 is aligned to a corresponding location to perform at least one exposure process. Then, the filter 400 is removed, and the photo mask 300 is moved to another corresponding location to perform at least one another exposure process.

Successively, referring to step 29 as shown in FIG. 2, it shows that un-exposure photoresist of the photoresist layer 220 is removed to form patterns 221, 223 with different dimensions on the substrate 210 during a developing process. In this step, the un-exposure photoresist which doesn't result photoreaction is removed by the developer solution. After the developing process, referring to FIG. 3D, the dimension of a first photoresist structure 221 on the corresponding location is larger than the dimension of a second photoresist structure 223 on another corresponding location due to the different exposure intensities.

In some embodiments of the present invention, it further comprises two steps after the developing process, namely, an inspection step and a hard-bake step, respectively. The inspection step is executed after the developing process is completed. The step is used for determining whether or not the location of photoresist patterns on the substrate 210 is accuracy; or whether or not there are defects. After the inspection step determines that the patterns structures fit the specification, the hard-bake step is executed. The hard-bake step is the last step in the lithography process, and this step is employed to heat the substrate 210 accomplishing the developing process and inspection step. The purpose of this step is to reduce the solvent amount within the photoresist as less as possible, to increase adhesions to prevent disarticulation and improve the resistance to acid, and smoothing edges to reduce defects such as cavities.

In view of the forgoing, the method for forming exposure patterns according to the present invention could be utilized to form patterns structures with different dimensions on a substrate by using a filter with a transmittance to perform at least two exposure processes, free of pluralities of lithography processes or expensive multi tone masks.

In order to illustrates the method for forming exposure patterns according to the present invention more clearly. Subsequently, another embodiment of the present invention is introduced, which is utilized the method of the present invention to a fabricating method of multi-domain vertical align (MVA) structures and photo spacer (PS) structures on a color filter.

The MVA structures and PS structures on the color filter have different dimensions. In general, a traditional method of fabricating the MVA structures and PS structures on the color filter comprises two lithography processes. Thus, it needs the longer fabricating time and higher cost of produce. If the fabricating process is reduced to one lithography process, an expensive multi tone mask is needed. Therefore, the method according to the present invention utilized a filter to perform at least two exposure processes to approach patterns structures with different dimensions or sizes can be utilized to the fabricating process of the MVA structures and PS structures on the color filter, so that this fabricating process can be reduced to one lithography process effectively. It's noted to this embodiment is only used for illustrating a preferred embodiment of the present invention, but not used to limit the scope of the present invention.

Figure 4:
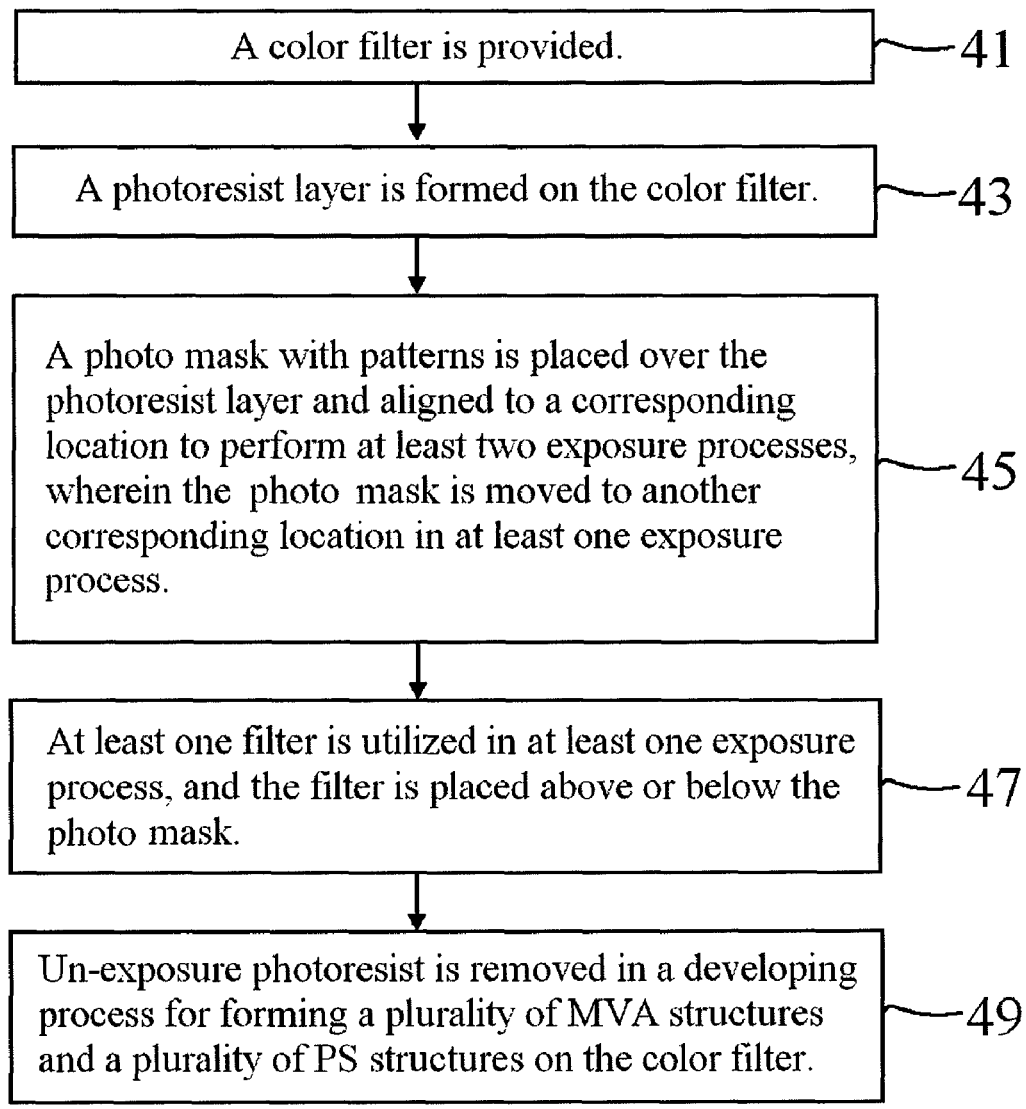
FIG. 4 shows a flow chart of an exposure method of a color filter according to the present invention.
Figure 5A:
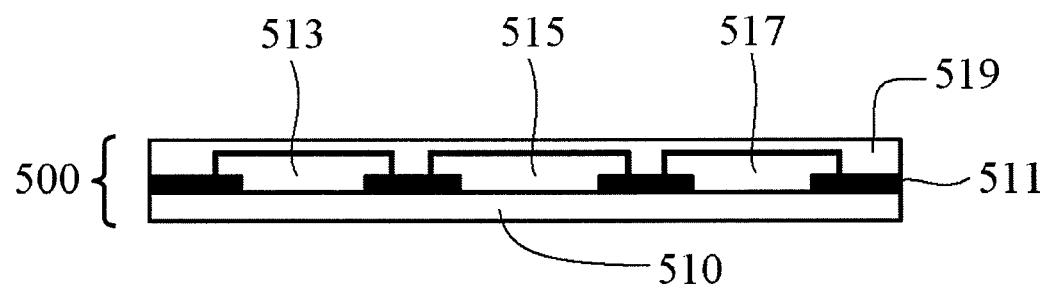
FIGS. 5A~5E show illustrations of the exposure method of a color filter according to the present invention.

Referring to FIG. 4, it shows a flow chart of an exposure method of a color filter, which is utilized the method for forming exposure patterns according to the present invention, and accompanying with FIGS. 5A~E to illustrate. First at all, the step 41 shown in FIG. 4, a color filter 500 is provided. Referring to FIG. 5A, the color filter 500 comprises a glass substrate 510, and a black matrix structure 511 is formed on the glass substrate 510. The black matrix structure 511 forms a plurality of square regions, and a color layer is formed in the square regions. The color layer comprises a red light layer 513, a blue light layer 515, and a green light layer 517. Because the highness of the color layer structure is different from the one of the black matrix structure 511, an over coat layer 519 will be covered on the color layer structure and the black matrix structure 511 for smoothing the surface of the color filter 500. Moreover, in this step, the surface of the color filter 500 would be cleaned and dried first for ensuring the qualities of the following fabricating process.

Figure 5B:
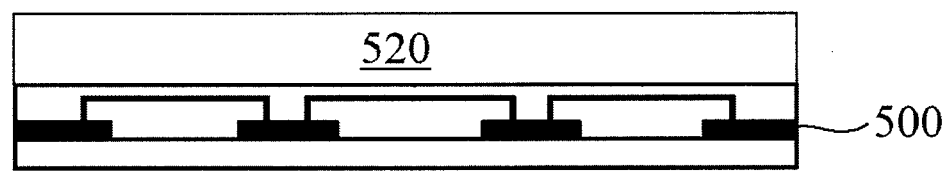

Subsequently, referring to step 43 shown in FIG. 4, and accompanying with FIG. 5B to illustrate. The step 43 involves a step of forming a photoresist layer 520 on the color filter 500. Similarly, this step of forming the photoresist layer 520 on the color filter 500 is also generally divided to two substeps, a photoresist coating step and a pre-bake step. The photoresist layer 520 with a thickness is coated on the color filter 500, and the thickness is depending on the specifications of the required PS structures. In some embodiment of the present invention, this photoresist coating step is approached by any traditional coating technologies, such as spin coating, slit and spin coating, spin-less coating, or die coating. In this embodiment, the photoresist coating step is carried on by spin-less coating for reducing cost. Moreover, the material of photoresist is a negative photoresist material in this embodiment. After completing the photoresist coating step, the smoothened surface of the photoresist layer 220 and the adherence will be guarantee by performing the pro-bake step.

After the photoresist layer 520 is formed on the color filter 500, a photo mask 310 with patterns is placed over the photoresist layer 520 and aligned by utilizing alignment marks to a predetermining corresponding location to perform at least two exposure processes, referring to step 45 shown in FIG. 4. In this step, the photo mask 310 is moved horizontally to align another corresponding location in at least one exposure process. Successively, referring to step 27 shown in FIG. 4, at least one filter 410 is provided, and the filter 410 is placed above or below the photo mask 310. In this embodiment, the corresponding location refers to the location of the PS structures and another corresponding location refers to the location of the MVA structures.

Figure 5C:
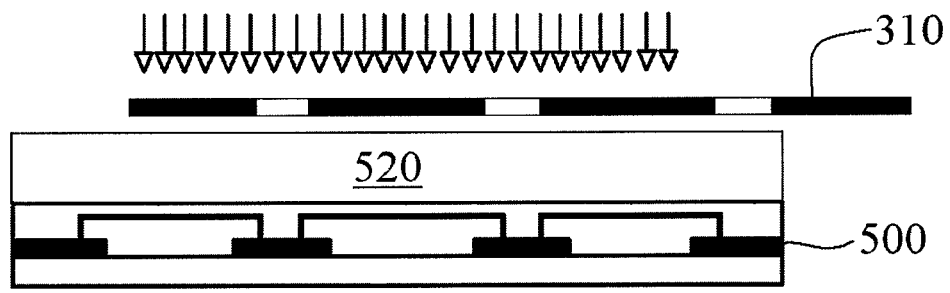
Figure 5D:
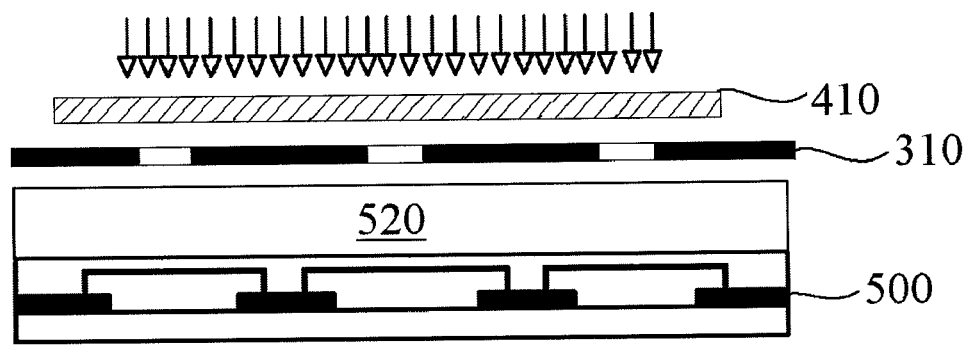
Figure 5E:
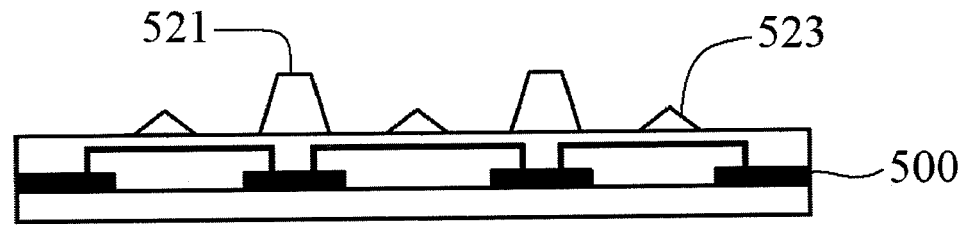

Referring to FIG. 5C according to the step 45, a photo mask 310 with patterns is placed over the color filter 500, which has a photoresist layer 520 thereon. Then, the photo mask 310 is moved and aligned to a demanded location of PS structures on the color filter 500. After alignment of the photo mask 310, at least two exposure processes would be performed, successively, wherein the photo mask 310 is moved to the desired location of MVA structures in at least one exposure process. In this embodiment, the light source in these exposure processes comprises ultraviolet ray. Subsequently, referring to FIG. 5D according to the step 47, at least one filter 410 is provided, and the filter 410 is placed above the photo mask 310. After the photo mask 300 aligned to another corresponding location, a filter 410 is placed above the photo mask 300 to perform at least one exposure process. In another embodiment of the present invention, the filter 410 is placed below the photo mask 310 to perform at least one exposure process.

The filter 410 has a transmittance which is lower than the one of vacuum. Thus, the light intensity of at least one exposure process is different from the others, and the photoreactions of the corresponding location and the another corresponding location of the photoresist layer 520 will be different. In certain embodiments of the present invention, the filter 410 comprises a filter with low transmittance. In another certain embodiments of the present invention, the filter 410 comprises a magnesia substrate or a chromium oxide substrate. A person having ordinary skill in the art appreciates the transmittance mentioned above could be changed depending on the specifications of the requiring PS structures and MVA structures, but not limited to a specify number.

It's noted that the step 45 and step 47 are exchangeable steps each other. In another embodiment of the present invention, a filter 410 is first utilized to place above or below the photo mask 310, and the photo mask 310 is aligned to a corresponding location to perform at least one exposure process. Then, the filter 410 is removed, and the photo mask 310 is moved to another corresponding location to perform at least one another exposure process.

Successively, referring to step 49 shown in FIG. 4, un-exposure photoresist of the photoresist layer 520 is removed to form the MVA structures 523 and the PS structures 521 on the color filter 510 during a developing process, wherein the MVA structure 523 and the PS structure 521 have the different dimensions. In this step, the un-exposure photoresist, which doesn't cause photoreaction, is removed by the developer solution. After the developing process, referring to FIG. 5E, the dimension of a PS structure 521 on the corresponding location is larger than the dimension of a MVA structure 523 on another corresponding location due to the different exposure intensities of the corresponding location and another corresponding location of the photoresist layer 520.

In this embodiment, it further comprises two steps after the developing process, namely, inspection step and hard-bake step, respectively. The inspection step is executed after the developing process, which is used to determine whether the locations of the MVA structures 523 and the PS structures 521 on the color filter 500 is accuracy or not; or whether there is other defect or not. After the inspection step for ensuring the specification of the PS structures 521 and the MVA structures are fulfilled, the hard-bake step is executed. The hard-bake step is utilized to reduce the solvent amount within the photoresist, thereby increasing adhesions to prevent disarticulation and improving the resistance to acid, and smoothening the edges to reduce the number of defects.

As mentioned above, the fabricating process of MVA structures and PS structures on a color filter by using at least one filter to perform at least one exposure process for forming patterns with different dimensions could not only reduces the number of fabricating steps and save the time of fabrication, but also reduce the manufacture cost due to saving the cost of photo masks.

It is noted that the numbers of the exposure process and the numbers of filter using according to the method of forming exposure patterns of the present invention are not specified or limited.

While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

What is claimed is:

1. A exposure method of a color filter, comprising: providing a color filter; forming a photoresist layer on said color filter; placing a photo mask with patterns over said photoresist layer and aligning to a corresponding location for performing at least two exposure processes, wherein at least one exposure process comprises a step of moving said photo mask to another corresponding location; providing at least one filter to perform at least one exposure process, wherein said filter is placed above or below said photo mask; and performing a developing process to remove parts of said photoresist layer for forming a plurality of photo spacer structures and a plurality of multi-domain vertical align structures on said color filter, wherein said photo spacer (PS) structures and said multi-domain vertical align (MVA) structures have different dimensions.

2. The exposure method according to claim 1, wherein said color filter comprises: a glass substrate; a black matrix disposed on said glass substrate; a color layer disposed on said black matrix and said glass substrate; and an over coat layer covering said black matrix and said color layer for flattening surface of said color filter.

3. The exposure method according to claim 2, wherein said color layer comprises red light layers, blue light layers, and green light layers.

4. The exposure method according to claim 1, wherein said filter has a transmittance which is lower than the one of vacuum.

5. The exposure method according to claim 1, wherein said transmittance is based on the demanded sizes of said MVA structures and said PS structures.

6. The exposure method according to claim 1, wherein said filter comprises a magnesia substrate or a chromium oxide substrate.

7. The exposure method according to claim 1, wherein a material of said photoresist layer is negative photoresist material.

8. The exposure method according to claim 1, the steps further comprising: determining whether locations of said MVA structures and said PS structures on said color filter is accurate or not; and performing a post-bake process for reducing the photoresist solvent amount, increasing adhesion to prevent disarticulation, enhancing resistance of acids, and smoothening edges to reduce defects.

* * * * *